(12) United States Patent
Sager et al.

(10) Patent No.: US 8,093,489 B2
(45) Date of Patent: *Jan. 10, 2012

(54) PHOTOVOLTAIC DEVICES FABRICATED FROM NANOSTRUCTURED TEMPLATE

(75) Inventors: Brian M. Sager, Menlo Park, CA (US); Martin R. Roscheisen, San Francisco, CA (US); Karl Pichler, Santa Clara, CA (US)

(73) Assignee: Nanosolar, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/564,047

(22) Filed: Sep. 21, 2009

(65) Prior Publication Data

US 2010/0084014 A1    Apr. 8, 2010

Related U.S. Application Data

(63) Continuation of application No. 10/771,092, filed on Feb. 2, 2004, now Pat. No. 7,605,327, which is a continuation-in-part of application No. 10/443,456, filed on May 21, 2003, now Pat. No. 6,946,597.

(51) Int. Cl.
   *H02N 6/00*    (2006.01)
(52) U.S. Cl. ........................................ 136/250
(58) Field of Classification Search .................... 136/250
   See application file for complete search history.

(56) References Cited

U.S. PATENT DOCUMENTS

| | | | |
|---|---|---|---|
| 4,499,658 A | 2/1985 | Lewis | |
| 4,865,999 A | 9/1989 | Xi et al. | |
| 4,939,050 A | 7/1990 | Toyosawa et al. | |
| 5,482,570 A | 1/1996 | Saurer et al. | |
| 5,525,440 A | 6/1996 | Kay et al. | |
| 5,571,612 A | 11/1996 | Motohiro et al. | |
| 5,674,325 A | 10/1997 | Albright et al. | |
| 5,986,206 A | 11/1999 | Kambe et al. | |
| 5,990,415 A | 11/1999 | Green et al. | |
| 6,075,203 A | 6/2000 | Wang et al. | |
| 6,278,056 B1 | 8/2001 | Sugihara et al. | |
| 6,291,763 B1 | 9/2001 | Nakamura | |
| 6,340,789 B1 | 1/2002 | Petritsch et al. | |

(Continued)

FOREIGN PATENT DOCUMENTS

DE    2741954    3/1979

(Continued)

OTHER PUBLICATIONS

Pierson, et al. (Handbook of Chemical Vapor Deposition (CVD): Principles, Technology, and Applicantions, William Andrew Publishing, New York, USA, Copyright 1999, p. 310.

(Continued)

*Primary Examiner* — Alexa D. Neckel
*Assistant Examiner* — Miriam Berdichevsky

(57) ABSTRACT

Photovoltaic devices, such as solar cells, and methods for their manufacture are disclosed. A device may be characterized by an architecture having a nanostructured template made from an n-type first charge transfer material with template elements between about 1 nm and about 500 nm in diameter with about $10^{12}$ to $10^{16}$ elements/m$^2$. A p-type second charge-transfer material optionally coats the walls of the template elements leaving behind additional space. A p-type third charge-transfer material fills the additional space volumetrically interdigitating with the second charge transfer material.

20 Claims, 5 Drawing Sheets

U.S. PATENT DOCUMENTS

| | | |
|---|---|---|
| 6,414,235 B1 | 7/2002 | Luch |
| 6,444,296 B1 | 9/2002 | Sasaki et al. |
| 6,472,594 B1 | 10/2002 | Ichinose et al. |
| 6,515,218 B1 | 2/2003 | Shimizu et al. |
| 6,517,958 B1 | 2/2003 | Sellinger et al. |
| 6,586,670 B2 | 7/2003 | Yoshikawa |
| 6,586,764 B2 | 7/2003 | Buechel et al. |
| 6,706,962 B2 | 3/2004 | Nelles et al. |
| 6,852,920 B2 | 2/2005 | Sager et al. |
| 6,936,761 B2 | 8/2005 | Pichler |
| 6,946,597 B2 | 9/2005 | Sager et al. |
| 6,987,071 B1 | 1/2006 | Bollman |
| 7,247,346 B1 | 7/2007 | Sager et al. |
| 7,253,017 B1 | 8/2007 | Roscheisen et al. |
| 7,291,782 B2 | 11/2007 | Sager et al. |
| 7,462,774 B2 * | 12/2008 | Roscheisen et al. .......... 136/256 |
| 7,511,217 B1 | 3/2009 | Roscheisen |
| 7,594,982 B1 | 9/2009 | Roscheisen |
| 7,605,327 B2 * | 10/2009 | Roscheisen et al. .......... 136/263 |
| 2002/0017656 A1 | 2/2002 | Graetzel et al. |
| 2002/0134426 A1 | 9/2002 | Chiba et al. |
| 2002/0192441 A1 | 12/2002 | Kalkan et al. |
| 2003/0005955 A1 | 1/2003 | Shiotsuka et al. |
| 2003/0204038 A1 | 10/2003 | Xiao et al. |
| 2003/0226498 A1 | 12/2003 | Alivisatos et al. |
| 2004/0084080 A1 | 5/2004 | Sager et al. |
| 2004/0103936 A1 | 6/2004 | Andriessen |
| 2004/0109666 A1 | 6/2004 | Kim, II |
| 2004/0118448 A1 | 6/2004 | Scher et al. |
| 2004/0146560 A1 | 7/2004 | Whitford et al. |
| 2004/0178390 A1 | 9/2004 | Whitford et al. |
| 2004/0219730 A1 | 11/2004 | Basol |
| 2004/0250848 A1 | 12/2004 | Sager et al. |
| 2005/0045874 A1 | 3/2005 | Xiao et al. |
| 2005/0098204 A1 | 5/2005 | Roscheisen et al. |
| 2005/0098205 A1 | 5/2005 | Roscheisen et al. |
| 2005/0121068 A1 | 6/2005 | Sager et al. |
| 2005/0183767 A1 | 8/2005 | Yu et al. |
| 2005/0183768 A1 | 8/2005 | Rocheisen et al. |
| 2005/0206306 A1 | 9/2005 | Perlo et al. |

FOREIGN PATENT DOCUMENTS

| | | | |
|---|---|---|---|
| EP | 1028475 | 8/2000 | |
| EP | 1087446 | 3/2001 | |
| EP | 1087446 A2 * | 3/2001 | ................... 136/243 |
| JP | 200077691 | 3/2000 | |
| WO | WO 02/084708 | 10/2002 | |

OTHER PUBLICATIONS

D. Zhao et al. "Triblock Copolymer Syntheses of Mesoporous Silica with Periodic 50 to 300 Angstrom Pores", Science, 279, 548-552. (1998).
R. Ryoo et al. "Block-Copolymer-Templated Ordered Mesoporous Silica: Array of Uniform Mesopores or Mesopore-Micropore Network?" J. Phys. Chem. B. 104, 11465-11471. (2000).
M.H. Huang et al. "Catalytic Growth of Zinc Oxide Nanowires by Vapor Trasnport" Adv. Mater. 13, 113-116 (Jan. 2001).
Final Office Action of May 25, 2004 for U.S. Appl. No. 10/319,406.
Non-Final Office Action of May 25, 2004 for U.S. Appl. No. 10/319,406.
Interview Summary of Jul. 23, 2004 for U.S. Appl. No. 10/319,406.
Final Office Action of Dec 15, 2006 for U.S. Appl. No. 10/303,665.
Non-Final Office Action of Jun. 29, 2006 for U.S. Appl. No. 10/303,665.
Non-Final Office Action of Mar. 31, 2006 for U.S. Appl. No. 10/303,665.
Non-Final Office Action of Oct. 20, 2005 for U.S. Appl. No. 10/303,665.
Interview Summary of Jun. 5, 2007 for U.S. Appl. No. 10/290,119.
Advisory Action of Oct. 12, 2006 for U.S. Appl. No. 10/290,119.
Final Office Action of Jul. 27, 2006 for U.S. Appl. No. 10/290,119.
Non-Final Office Action of Dec. 14, 2005 for U.S. Appl. No. 10/290,119.
Non-Final Office Action of May 31, 2007 for U.S. Appl. No. 10/771,250.
Final Office Action of Dec. 13, 2007 for U.S. Appl. No. 10/771,250.
M Granstrom, K. Petritsch, A. C. Arias, A. Lux, M. R. Andersson & R. H. Friend. 1998. Laminated fabrication of polymeric photovoltaic diodes. Nature 395, 257-260.
Gebeyehu, D., Brabec, C.J., Saricifti, N. S., Vangeneugden, D., Kiebooms, R., Vanderzande, D., Kienberger, F., and H. Schnindler. 2002. Hybrid Solar Cells based on dye-sensitized nanoporous TiO2 electrods and conjugated polymers as hole transport materials. Synthetic Metals 123, 279-287, (2002).
Greg P. Smestad, Stefan Spiekermann, Janusz Kowalik, Christian D. Grant, Adam M. Schwartzberg, Jin Zhang, Laren M. Tolbert, and Ellen Moons. 2002. A technique to compare polythiophene solid-state dye sensitized TiO2 solar cells to liquid junction devices.Solar Energy Materials & Solar Cells, in press, date unknown.
Hongyou Fan, Yunfeng Lu, Aaron Stump, Scott T. Reed, Tom Baer, Randy Schunk, Victor Perez-Luna, Gabriel P. Lopez & C. Jeffrey Brinker. 2000. Rapid prototyping of patterned functional nanostructures, Nature 405, 56-60, May 2000.
Alan Sellinger, Pilar M.Weiss, Anh Nguyen, Yunfeng Lu, Roger A. Assink, Weiliang Gong & C. Jeffrey Brinker. 1998. Continuous self-assembly of organic-inorganic nanocomposite coatings that mimic nacre. Nature 394, 256-260, Jul. 1998.
Yunfeng Lu, Rahul Ganguli, Celeste A. Drewien, Mark T. Anderson, C. Jeffrey Brinker, Weilang Gong, Yongxing Guo, Hermes Soyez, Bruce Dunn, Michael H. Huang & Jeffrey I. Zink. 1997. Continuous formation of supported cubic and hexagonal mesoporous films by sol-gel dip-coating. Science 288, 652-656.
L. Schmidt-Mende, A. Fechtenkotter, K. Mullen, E. Moons,R. H. Friend, J. D. MacKenzie. 2002. Self-Organized Discotic Liquid Crystals for High-Efficiency Organic Photovoltaics. Science 293, 1119-1122, Aug. 2001.
Wendy U. Huynh, Janke J. Dittmer, A. Paul Alivisatos. 2002. Hybrid Nanorod-PolymerSolar Cells. Science 295, 2425-2427, Mar. 2002.
Thuc-Quyen Nguyen, Junjun Wu, Vinh Doan, Benjamin J. Schwartz, Sarah H. Tolbert. 2000. Control of Energy Transfer in Oriented Conjugated Polymer-Mesoporous Silica Composites. Science 288, 652-656, Apr. 2000.
Heeger, A.J. 2002 Semiconducting and metallic polymers: the fourth and fifth generation of polymeric materials. Synthetic Metals 125, 23-42 (2002).
Michael H. Huang, Amer Choudrey and Peidong Yang, "Ag Nanowire Formation within Mesoporous Silica" Chem. Commun., 2000, 1063-1064.
Andrew A. Gewirth, Panos C. Andricacos, and Jay A. Switzer, with John O. Dukovic, editor "Hot Topics in Electrodeposition", The Electrochemical Society Interface .cndot. Spring 1998.
Heini Saloniemi, "Electrodeposition of PbS, PbSe and PbTe Thin Films" by Heini Saloniemi,VTT Publications 423, Dec. 15, 2000, an electronic copy of which may be accessed at http://www.inf.vtt.fi/pdf/publications/2000/P423.pdf.
Huang Y, Duan, X, Wei, Q, & C.M. Lieber, "Directed Assembly of One-Dimensional Nanostructures Into Functional Networks" Science 291(5504):630-633 (2001).
Byung Hee Hong, Sung Chul Bae, Chi-Wan Lee, Sukmin Jeong, and Kwang S. Kim, "Ultrathin Single-Crystalline Silver Nanowire Arrays Formed in an Ambient Solution Phase", Science 294: 348-351; Published online Sep. 6, 2001.
Justin D. Holmes, Keith P. Johnston, R. Christopher Doty, and Brian A. Korgel, "Control of Thickness and Orientation of Solution-Grown Silicon Nanowires" Science Feb. 25, 2000; 287: 1471-1473.
Lu, Y., Yang, Y., Sellinger, A., Lu, M., Huang, J., Fan, H., Haddad, R., Lopez, G., Burns, A.R., Sasaki, D.Y., Shelnutt, J., and C. J. Brinker, "Self-Assembly of Mesoscopically Ordered Chromatic Polydiacetylene Nanocomposites", Nature 410: 913-917 (2001.).
Halls et al., "Efficient Photodiodes from interpenetrating Polymer Networks", Nature, vol. 376 Aug. 10, 1995.
O'Regan et al. "A Low-cost, High-efficiency solar cell based on dye-sensitized colloidal TiO.sub.2 Films", Nature, vol. 353 pp. 737-740, Oct. 24, 1991.
Mapes et al., "Ionic Conductivities of Poly(siloxane) Polymer Electrolytes with Varying Length of Linear Ethoxy Sidechains, Different Molecular Weights, and Mixed Copolymers", Polymer Preprints, 41(1), pp. 309-310 (2000).

Hooper et al., "A Highly Conductive Solid-State Polymer Electrolyte Based on a Double-Comb Polysiloxane Polymer with Oligo(ethylene oxide) Side Chains", Organometallics, vol. 18, No. 17, Aug. 16, 1999.

Nazeeruddin et al. "Conversion of Light to Electricity by cis-$X_2$ Bis(2,2'-bipyridyl-4,4'-dicarboxylate) ruthenium(II) Charge-Transfer Sensitizers ($X=Cl^-$, $BR^-$, $I^-$, $CN^-$, and $SCN^-$) on Nanocrystalline $TiO_2$ Electrodes", Journal of the American Chemical Society 1993, 115, pp. 6382-6390 (1993).

Green et al. "Solar Cell Efficiency Tables (version 11)", Proges in Photovoltaics: Research and Applications, 6, 35-42 (1998).

Gebeyehu et al, "Solid-State Organic/inorganic Hybrid Solar Cells Based on Conjugated Polymers and Dye-Sensitized $TiO_2$ Electrodes", Thin Solid Films, 403-404, pp. 271-274 (2002).

Barbe et al., "Nancrystalline Titanium Oxide Electrodes for Photovoltaic Applications", Journal of the American Ceramic Society, 80 (12), pp. 3157-3171 (1997).

A. P. Li et al., "Polycrystalline Nanopore Arrays with Hexagonal Ordering on Aluminum," Journal of Vacuum Science and Technology A 17(4) Jul./Aug. 1999.

M. Steinhart et al, "Polymer Nanotubes by Wetting of ordered Porous Templates," Science vol. 296, Jun. 14, 2002.

S.Z Chu et al., "Synthesis and Characterization of Titania Nanostructures on Glass by Al Anodization and Sol-Gel Process," Chem. Mater. 14, pp. 266-272, 2002.

S.Z Chu et al., "Fabrication and Characteristics of Ordered Ni Nanostructures on Glass by Anodization and Direct Current Electrodeposition," Chem. Mater. 14, pp. 4595-4602, 2002.

J. Kruger et al, "High Efficiency Solid-State Photovoltaic Device Due to Inhibition of Interface Charge Recombination," Applied Physics Letters, vol. 79, No. 13, 24, pp. 2085-2087, Sep. 2001, American Institute of Physics, College Park, MD.

P. Wang, et al. "A Stable Quasi Solid-State Dye-Sensitized Solar Cell with an Amphiphillic Ruthenium Sensitizer and Polymer Gel Electrolyte", Nature Materials, vol. 2, Jun. 2003 pp. 402-407 (Published online May 18, 2003), Nature Publishing Group, London, UK.

L. Drummy et al., "Direct Imaging of Defect Structures in Pentacene Nanocrystals" Advanced Materials vol. 14, No. 1, pp. 54-57 Jan. 4, 2002, Wiley-VCH, Verlag GmbH, Wienheim, Germany.

F. Cao, et al, "A Solid State, Dye Sensitized Photoelectrochemical Cell", Journal of Physical Chemistry, vol. 99, pp. 17071-17073, 1995.

B. O'Reagan, et al., "Large Enhancement in Photocurrent Efficiency Caused by UV Illumination of the Dye Sensitized Hereojunction $TiO_2$/RuLL'NCS/CuSCN: Initiation and Potential Mechanisms", Chemical Materials, vol. 10, pp. 1501-1509, published on the web, May 20, 1998, American Chemical Society, Washington, DC.

E. Strathatos et al, "A Quasi Solid State Dye Sensitized Solar Cell Based on a Sol Gel Nanocomposite Electrolyte Containing Ionic Liquid", Chemical Materials, vol. 15, pp. 1825-1829, published on the web, Apr. 5, 2003, American Chemical Society, Washington, DC.

K. Tennakone et al, "A Dye-Sensitized Nano-Porous Solid-State Photo Voltaic Cell" Semiconductor Science and Technology, vol. 10, pp. 1689-1693, IOP Publishing, UK 1995.

D. Gong et al., titanium oxide nanotube arrays prepared by anodic oxidation, in J. Mater. Res., vol. 16, No. 12, pp. 3331-3334, Dec. 2001, Materials Research Society.

R. Beranek et al, "Self-Organized Porous Titanium Oxide Prepared in $H_2SO_4$/HF Electrolytes," in Electrochemical and Solid-State Letters, vol. 6, No. 3, pp. B12-B14, Jan. 17, 2003, Electrochemical Society, Inc.

V. Zwilling et al., "Structure and Physiochemistry of Anodic Oxide Films on Titanium and TA6V Alloy," in Surface and Interface Analysis, vol. 27, pp. 629-637, 1999, John Wiley and Sons, Ltd.

V. Zwilling et al., "Anodic oxidation of titanium and TAV6 alloy in chromic media. An electrochemical approach," in Electrochemica Acta. vol. 45, pp. 921-929, 1999, Elsevier Science, Ltd.

Merriam Webster Online Dictionary entry for "template" [online], [retrieved on Jul. 16, 2004]. Retrieved from the Internet ,<URL: http://www.m-w.com/cgi-bin/dictionary?book=Dictionary &va=template>.

Merriam Webster Online Dictionary entry for "particulate" [online], [retrieved on Jun. 9, 2004]. Retrieved from the Internet ,<URL: http://www.m-w.com/cgi-bin/dictionary?book=Dictionary &va=particulate>.

* cited by examiner

PHOTOVOLTAIC DEVICES FABRICATED FROM NANOSTRUCTURED TEMPLATE

CROSS-REFERENCE TO RELATED APPLICATIONS

This application is continuation of U.S. patent application Ser. No. 10/771,092 filed Feb. 2, 2004 now U.S. Pat. No. 7,605,327, which is a continuation-in-part of and claims priority to commonly assigned U.S. patent application Ser. No. 10/443,456 filed May 21, 2003, now U.S. Pat. No. 6,946,597, the entire disclosures of all of which are incorporated herein by reference.

FIELD OF THE INVENTION

This invention is directed to photovoltaic devices and methods for their production, and more specifically to nanostructured photovoltaic devices.

BACKGROUND OF THE INVENTION

Organic and hybrid organic/inorganic solar cells have been described, e.g., in (Shaheen et al. "2.5 Percent Efficient Organic Plastic Solar Cells," Applied Physics Letters 78, 841-843 (2001); Peumans, P. and S. R. Forest. "Very-high efficiency double-heterostructure copper pthalocyanine/C60 photovoltaic cells", Applied Physics Letters 79 (1): 126-128 (2001); Huynh et al., "Hybrid Nanorod-Polymer Solar Cells", Science 295, 2425-2427 (2002); Schmidt-Mende et al., "Self-Organized Discotic Liquid Crystals for High-Efficiency Organic Photovoltaics", Science 293, 1119-1122 (2002)).

In these solar cell devices, however, the device architectures are suboptimal in terms of their nanometer-scale morphology, and improvements are needed to obtain higher-efficiency devices. In particular, the morphology of the active layer of a more optimal device would have an architecture of nanometer scale ordered interdigitation due to the nature of the exciton-based physics. The lifetime of migrating excitons is extremely short, and as such an exciton can typically diffuse only about 10 nm (or at most 10's of nm) before the electron and hole spontaneously (and non-productively) recombine. Thus, to separate the electron away from the hole with which it is bound (and ultimately generate electricity), an exciton must reach the junction to another material (one with higher electron affinity) within 10's of nm of where it was initially created.

In solar-cell devices of the prior art, the morphology of the active layer has been quasi-random. Furthermore, in devices of the prior art, the movement of charges through the active materials of the devices required regularly and closely spaced nanoparticles or nanorods that could collect and transport free electrons to the outer boundary of the active layer of the device. The lack of uniform spacing in these devices decreased the hole and electron transport efficiency.

An alternative approach to building an organic solar cell has been developed by Michael Graetzel and his colleagues, who have constructed dye-sensitized, nanocrystalline $TiO_2$ based solar cells using a liquid electrolyte (O'Regan et al. "A Low-cost, High-efficiency solar cell based on dye-sensitized colloidal $TiO_2$ Films", Nature, Vol. 353 pp 737-740, 24 Oct., 1991). Dye-sensitized solar cells (DSSC) disaggregate the processes of light absorption and charge separation. A monolayer of a Ruthenium-based dye that is chemically adsorbed onto a semiconductor surface absorbs light. After having been excited by a photon, the dye injects an electron into a nano-particulate past composed of a semiconductor, $TiO_2$ (titania), upon which the electric field inside the titania allows extraction of the electron. In a parallel process, positive charge is transferred from the dye to a liquid iodide/triiodide-based redox mediator, which allows hole transfer through the solution to a counter electrode, after which the redox mediator is returned to its reduced state, closing the circuit.

Although Graetzel cells can reach 10% efficiency in optimized devices, the only suitable electrolyte (in terms of the speed of the associated redox reaction, etc.) is also highly corrosive. There is no known effective way to seal the cell with the liquid $I^-/I_3^-$ electrolyte. Even if cell could be effectively sealed, the corrosiveness of the electrolyte is a potential hazard that has discouraged large-scale production of Graetzel cells.

Several approaches have been taken to replace the liquid iodide/triiodide electrolyte with a solid-state material that exhibits sufficient hole transport for efficient device function. These approaches include: (1) Application of ionic conducting polymer gels (Wang et al., 2003), (2) sol-gel nanocomposites containing an ionic liquid (Stathatos et al., 2003), (3) ionic conductors (Cao et al., 1995), (4) inorganic p-type semiconductors, such as CuI or CuSCN (Tennakone et al., 1995; O'Regan and Schwartz, 1998; O'Regan et al., 2003), and (5) low molecular weight organic hole conductors such as 2,2'7,7'tetrakis(N,N-di-p-methoxyphenyl-amine)-9,9'-spirobifluorene(spiro-Me OTAD) (Krüger et al., 2001).

While each of these approaches has succeeded in producing a functional solid-state DSSC, the AM1.5G power conversion efficiency of all of these devices has typically been relatively low, due in part to losses resulting from an irregular titania morphology, which limits the accessible cavities within the tortuously arranged and sintered paste of the nano-particulate titania, leading to incomplete filling of the solid-state electrolyte material. For example, a DSSC using CuSCN as a solid-state hole conductor showed only 65% filling efficiency for 6-micron thick cells, with the filling efficiency dropping as the cell thickness was increased towards that of a typical DSSC (O'Regan et al, 2003).

Another shortcoming of dye-sensitized solar cells such as Graetzel cell is that a monolayer of dye or pigment such as the ruthenium pigment sensitizes the titania particles. Thus light is typically absorbed only in the monolayer at the surface the $TiO_2$ nanospheres and not in the bulk of the dye or pigment, resulting in lower absorption efficiency per unit volume of the active layer in the solar cell. Further, the absorption spectrum of the ruthenium dye is not fully matched to the irradiance spectrum of sunlight, and this mismatch decreases the potential light absorption from which electrons could be harvested. Taken together, these factors limit the potential efficiency of the current approaches to solid-state DSSC technology.

Thus, there is a need in the art for a solar cell architecture/active-layer morphology that overcomes the above difficulties.

DETAILED DESCRIPTION OF THE INVENTION

Figure 1A:
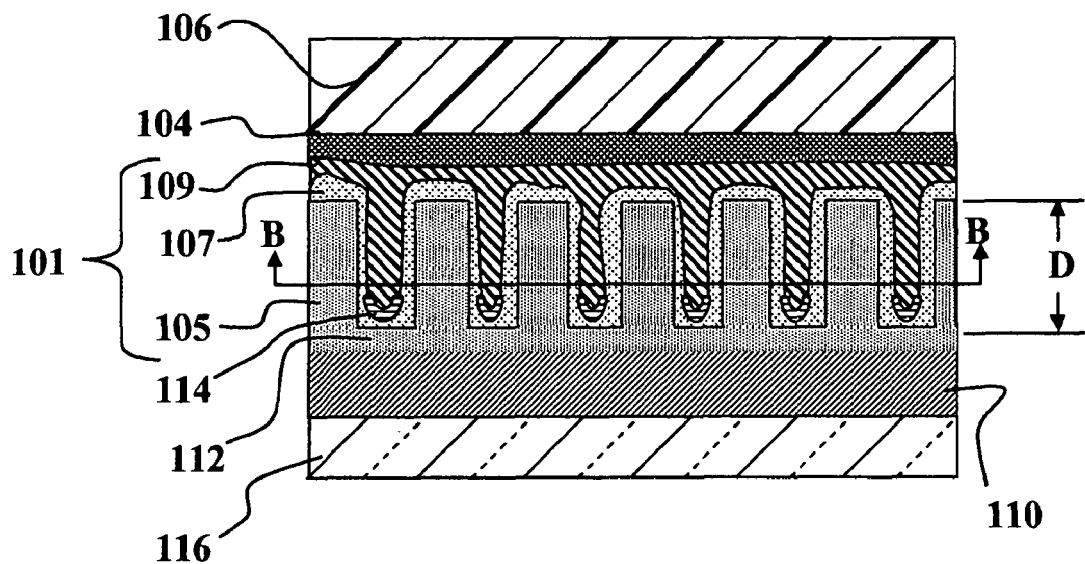
FIG. 1A shows a vertical cross-sectional schematic of a device according to an embodiment of the present invention.
Figure 1B:
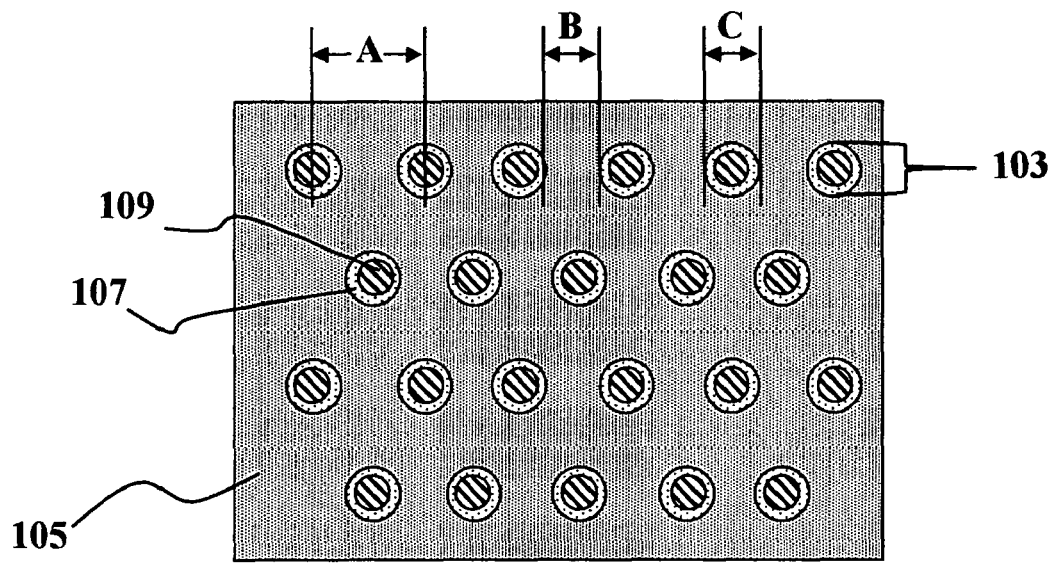
FIG. 1B is a horizontal cross-sectional schematic of the device of FIG. 1A taken along line B-B.

Contents
I. Glossary
II. General Overview
III. Photovoltaic Device
IV. Photovoltaic Device Fabrication
V. Alternative Embodiments
VI. Conclusion

I. Glossary

The following terms are intended to have the following general meanings as they are used herein:

The article "A", or "An" refers to a quantity of one or more of the item following the article, except where expressly stated otherwise, e.g., "a single" layer.

Active Layer generally refers to the layer within a photovoltaic or solar cell device where conversion of radiant energy to electrical energy takes place.

Anodization refers to the formation of a film, such as an oxide, on a conducting material, such as a metal, by electrolysis.

Array refers to a regular arrangement of objects or structures over a scale of distance greater than some characteristic dimension of a typical structure or object in the array.

Buckminsterfullerene or Fullerene: refers to molecular cages consisting, e.g., of only carbon atoms or mostly carbon atoms. The arrangement of the atoms is almost exclusively in the form of hexagons and pentagons. For example, 12 pentagons and 20 hexagons make a $C_{60}$ cage, which is 10 Å in diameter, with a 4-Å cavity. Fullerenes also have other useful forms, such as $C_{20}$, $C_{36}$, $C_{60}$, $C_{70}$, $C_{76}$, $C_{84}$, etc. Buckminsterfullerene/Fullerenes include derivatives such as doped, functionalized (e.g. COOH or otherwise functionalized, solubilized fullerenes e.g., phenyl-$C_{61}$-butyric acid methyl ester (PCBM), and derivatives thereof, and polymerized fullerenes or combinations thereof as well as fullerene-like molecular cages with or without carbon.

Charge-transfer Material generally refers to a semiconductor, such as an n-type electron acceptor or a p-type hole acceptor.

Complementary charge-transfer properties: As used herein, a first and second semiconductor or conductor materials are said to have complementary charge-transfer properties with respect to each other when the first material is a hole-acceptor and/or hole-transporter with respect to the second and the second is an electron-acceptor and/or electron-transporter with respect to the first or vice versa. Two materials can have complementary charge-transfer properties if they have different electron affinities.

Cone refers to shape having symmetry about an axis and a tapering cross-section.

Cylinder refers to a shape having symmetry about an axis and a substantially constant cross-section.

Device: An assembly or sub-assembly having one or more layers of material.

Efficiency: For a photovoltaic device or active layer, the efficiency is the ratio of energy output (e.g., in the form of electrons) to the necessary energy input (e.g., in the form of photons).

Electrochemical refers to the process of driving a chemical reaction by passing an electric current through a reaction mixture.

Electrolysis refers to the process of driving a redox reaction in the reverse by passing an electric current through a reaction mixture.

Element Spacing refers to the distance between neighboring template elements measured e.g., in terms of the number of elements per unit area, center-to-center distance between elements or, in the case of pore-like elements, wall thickness.

Elongated Structures refers to geometrical shapes such as tubes, pillars, free-standing pillars, cylinders, needle- or whisker-like elongated crystals, protruding from a layer of material, as well as openings such as pores, and channels, e.g., generally hollow and substantially straight vertical openings, formed into or through a layer of material.

Hole-Acceptor, Electron-Acceptor: Hole-acceptor and electron-acceptor are relative terms for describing charge-transfer between two materials. E.g., for two semiconductor materials wherein a first material has a valence band edge or highest occupied molecular orbital (HOMO) that is higher than the corresponding valence band edge or HOMO for a second material, and wherein the first material has a conduction band edge or lowest unoccupied molecular orbital (LUMO) that is higher than the corresponding conduction band edge or LUMO for the second material, the first material is a hole-acceptor with respect to the second material and the second material is an electron-acceptor with respect to the first material. A particular band edge or molecular orbital is said to be "higher" when it is closer the vacuum level.

Hybrid Organic-Inorganic, with respect to photovoltaic devices and solar cells, refers to a device that uses both organic and inorganic materials either within a layer, in different layers or some combination of both.

Includes, including, e.g., "such as", "for example", etc., "and the like" may, can, could and other similar qualifiers used in conjunction with an item or list of items in a particular category means that the category contains the item or items listed but is not limited to those items.

Inorganic Materials: Materials which do not contain carbon as a principal element. Examples include metal-oxides and mixed metal oxides. These include both conductive materials (e.g. oxides such as titania, ITO, $SnO_x$, F-doped $SnO_x$, Al-doped $ZnO_x$, $ZnO_x$, etc.) and non-conductive materials such as $AlO_x$, $SiO_x$, etc.

Layer refers to a feature characterized by a substantially greater length and/or width compared to its thickness. A layer may be composed of multiple elements in a substantially two-dimensional array or two or more sub-layers stacked on top of one another or some combination of both.

Nanostructured: generally refers to the property of having features with a characteristic dimension on the order of several nanometers ($10^{-9}$ m) up to several ten's or hundreds of nm across.

Organic Materials: Compounds, which principally consist of carbon and hydrogen, with or without oxygen, nitrogen or other elements, except those in which carbon does not play a critical role (e.g., carbonate salts). Examples of organic materials include:

(a) Organic Dyes and pigments such as perylenes, phthalocyanines, merocyanines, terylenes and squaraines and their derivatives.

(b) Polymers: Materials consisting of large macromolecules composed of more than one repeating units. Polymers, composed of 2-8 repeating units are often referred to as oligomers. Examples of such repeating units include, e.g., dyes or pigments.

(c) Small Molecules, including pthalocyanines (e.g., CuPc), pentacene, $C_{60}$ or other fullerenes, as well as their respective precursors and derivatives.

Organic Solar Cell: A type of solar cell wherein an active photoelectric layer is fabricated, either partly or entirely, using organic materials, e.g., polymers, oligomers, molecules, dyes, pigments (including mixtures).

Photovoltaic Device: A device that absorbs radiation and coverts energy from the radiation into electrical energy. Solar cells are examples of photovoltaic devices.

Radiation: Energy which may be selectively applied including electromagnetic energy having a wavelength between about $10^{-14}$ and about $10^4$ meters including, for example, gamma radiation, x-ray radiation, ultraviolet radiation, visible light, infrared radiation, microwave radiation and radio waves.

Semiconductor: As used herein, semiconductor generally refers to a material characterized by an electronic bandgap typically between about 0.5 eV and about 3.5 eV.

Solar Cell: A photovoltaic device that interacts with radiation (often in the form of sunlight) impinging on the device to produce electric power/voltage/current.

Template Element refers to a topological feature formed in a layer of template material.

Template Pore refers to a pore formed in a layer of template material

Tubule refers to a hollow tube-like structure. A tubule can be formed, e.g., within a template element, such as a pore or channel, in which case the tubule can have a symmetry axis aligned substantially along the symmetry axis of the template element.

Tubule Pore refers to a central hollow space within a tubule that is substantially aligned along the symmetry axis of the tubule.

II. General Overview

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention provide a photovoltaic device is built from a nanostructured having template elements made from a first charge transfer material. A second (complementary) charge-transfer material coats the walls of the template elements leaving behind additional space. A third material fills the additional space. In particular embodiments, the nanostructured template is made of an n-type inorganic semiconducting material, the second-charge-transfer material is a p-type organic semiconducting material and the third charge-transfer material is either a second p-type material (which could be the same as the second charge-transfer material) or an electrically conductive material.

III. Photovoltaic Device

FIG. 1A depicts a portion of a photovoltaic device 100 according to an embodiment of the present invention. The device 100 generally includes an active layer 101 disposed between two electrodes e.g., a base electrode 110 and a top electrode 106. An optional interface layer 104 may be disposed between the active layer 101 and the top electrode 106. The base electrode 110 may be disposed on an optional substrate 116. In addition, a semiconducting or conducting underlayer (not shown) can optionally be disposed between the active layer 101 and the base electrode 110.

The top electrode 106 and base electrode 110 may be conductive electrodes or they could include non-conductive materials that provide support, e.g., for conductive layers that serve as the actual electrodes. The base electrode 110 may be in the form of a commercially available sheet material such as such as C-, Au-, Ag-, Al-, or Cu-coated Steel Foil or metal/alloy-coated plastic foils, including metal or metallized plastic substrates/foils that are planarized to reduce surface roughness. The base electrode may be pre-patterned (or patterned at a suitable stage during device fabrication) to facilitate parallel and/or series wiring of individual devices as commonly used in the fabrication of PV cell modules. In this context, pre-patterning may result in individual electrically insulated base electrode segments.

The base electrode 110 may alternatively be made from a transparent conducting material, e.g., indium tin oxide and the like disposed, e.g., on a glass or plastic substrate. The top electrode 106 may be a transparent electrode, e.g., a layer of transparent conducting oxide (TCO) such as indium tin oxide (ITO), Zinc Oxide (ZnO), or fluorinated tin oxide ($F:SnO_2$). The top electrode 106 may optionally include (either with or without a TCO) some combination of a transparent conducting polymer, a thin metal layer or an array of spaced apart wires, e.g., in the form of a mesh, grid or parallel wires. The optional interface layer 104 may include a short-proofing barrier layer or an additional conducting polymer or organic material. Examples of suitable organic materials include PEDOT (Baytron), PEDOT doped with a dopant such as polystyrene sulfonic acid (PSS), 2,2'7,7'-tetrakis(N,N-di-p-methoxyphenyl-amine)-9,9'-spirobifluorene (spiro-MeO-TAD), or polyaniline doped with a dopant such as polystyrene sulfonic acid (PSS). In a particular embodiment, the interface layer 104 is poly-3,4-ethylenedioxythiophene-polystyrene-sulfonic acid (PEDOT-PSS). In some embodiments, both the top electrode 106 and base electrode 110 may be transparent. It is also possible to switch the locations of the top electrode 106 and base electrode 110.

The active layer 101 includes a nanostructured template 105 made from a first charge-transfer material and second and third charge-transfer materials 107, 109. It is often desirable that the template 105 be made from a material that is transparent in the visible and near IR light ranges. In a preferred embodiment, the porous template is made of a conducting or n-type semiconducting material. By way of example, the template 105 can be made from titania (titanium oxide, $TiO_2$) or another metal oxide or other oxide. For example, the template 105 can be made of zinc oxide (ZnO), zirconium oxide, lanthanum oxide, niobium oxide, tungsten oxide, tin oxide, strontium oxide, calcium/titanium oxide, indium oxide, tungsten oxide, vanadium oxide, zirconium oxide, molybdenum oxide, vanadium oxide, strontium oxide, sodium titanate, potassium niobate, silicon (e.g., n-type doped), cadmium selenide (CdSe), zinc selenide (ZnSe), cadmium sulfide (CdS), cadmium telluride (CdTe), zinc telluride (ZnTe), cadmium telluride selenide (CdTeSe), cadmium indium selenide ($CdInSe_2$) as well as blends or alloys of two or more such materials.

In preferred embodiments, the template 105 is formed by oxidizing a layer of metal. The layer of metal, e.g., titanium foil, may be partially anodized such that an anodized portion forms the template 105 and an un-anodized portion acts as the base electrode 110. Portions 112 of the template 105 proximate an interface between the anodized and un-anodized portions may act protect against direct contact between the base electrode and the second charge transfer material 107. Although the template 105 is generally described as being made of an inorganic material, organic materials may be used as well.

Preferably, the template 105 contains template elements 103, which may be distributed in a substantially uniform fashion, although exact uniform pore spacing, pore shape or pore size are not strictly required. The template elements 103 can be elongated structures, such as tubes, channels, pores, pillars, and the like, that are substantially cylindrical in shape. Alternatively, the template elements 103 can have a cone-like shape, e.g., truncated cones tapering with the wider end furthest from to the layer of metal 108, i.e., towards the top of the drawing in FIG. 1A. The cone-like shape may also be reversed, i.e., with the wider openings being at the bottom and the narrower openings at the top. In some embodiments, the template elements 103 are in the form of nanotubes, e.g., hollow tubes that protrude from the template 105 with spaces between the sidewalls of the tubes.

The template elements 103 may be characterized by an average element spacing A, an average wall thickness B, and an average diameter C. The average spacing A may be measured, e.g., from center-to-center, and may range from about 10 nm to about 500 nm. In the case of tube-shaped template pores 103 the tubes may protrude 50 to 500 nm above the template 105. Such tubes may have diameters ranging from 1 nm to 500 nm with tube walls up to 50 nm thick.

For hollow template elements, the average wall thickness B can range from less than about 5 nm to about 50 nm. The average diameter C may be in the range of several tens of nanometers to several hundred nanometers. For example, it is possible to form pores as small as about 1 nm to as large as about 500 nm in diameter. The density of the template elements 103 can range from about $10^{12}$ elements per square meter to about $10^{16}$ elements per square meter. For elements of a given diameter C and densities greater than about $1/C^2$ the elements tend to overlap and merge with one another, although some degree of overlapping/merging may be acceptable. Also, the diameter C may be larger than the wall thickness B between neighboring template elements 103.

The template 105 may be further characterized by a thickness D. The thickness D may be the thickness of an entire metal layer from which the template 105 is formed, if the metal layer is oxidized entirely. Alternatively, the thickness D may be the thickness of an oxidized portion of a metal layer is partially oxidized. Preferably, the template 105 is relatively thin. For example, the thickness D may be from about 50 nm to about 2000 nm (2 microns) thick.

Figure 1C:
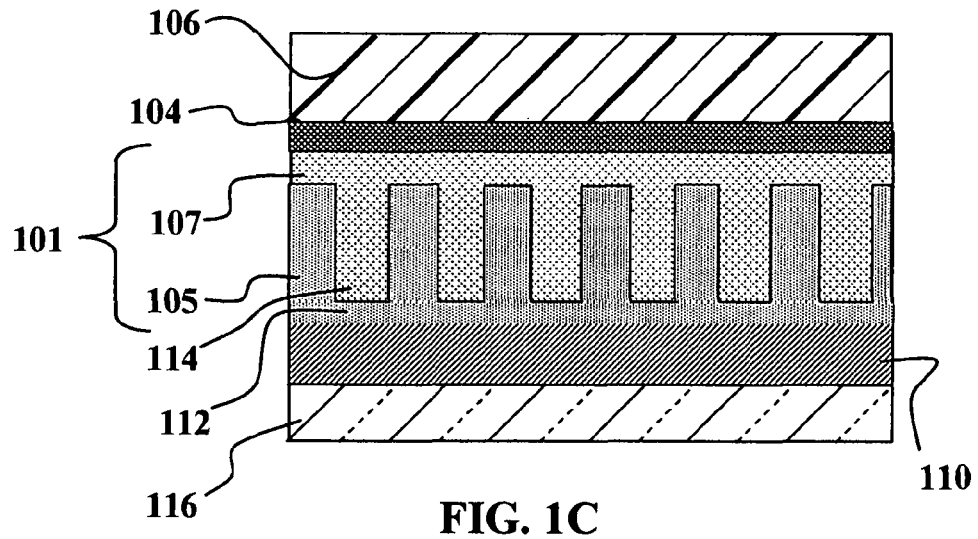
FIG. 1C is a vertical cross-sectional schematic diagram of an alternative device according to an embodiment of the present invention.

The second charge-transfer material 107 is generally a p-type semiconductor that coats the template elements 103 in a substantially conformal fashion that leaving behind additional space. The third charge-transfer material 109 fills the additional space. It is often desirable that the second charge-transfer material does not extend significantly beyond the surface of the nanostructured template 105. Thus, the second charge transfer material 107 may coat the template elements 103 up to a level that is substantially even with an upper surface of the template 105. The second charge transfer material 107 may coat the tops of the template elements 103 to avoid direct contact between the third charge transfer material 107 and the template 105. In a preferred embodiment the second and third charge transfer materials 107 and 109 can be the same material. In other words, the active layer 101 may include the template 105 with the first charge-transfer material 107 filling space between or within the template elements 103 as depicted in FIG. 1C.

The material of the template 105 and the first charge-transfer material 107 have complementary charge-transfer properties with respect to each other. In general one of these two materials may be regarded as an electron acceptor while the other may be regarded as a hole acceptor. Charge-transfer materials may be characterized by a lowest unoccupied molecular orbital (LUMO) or conduction band and a highest occupied molecular orbital (HOMO) or valence band as indicated schematically in FIG. 1D. Where two charge transfer materials with different energy levels meet at an interface INT electrons e− tend to move across the interface INT from the higher LUMO or conduction band to the lower LUMO or conduction band. Similarly, holes h+ tend to move across the interface INT from the lower HOMO or valence band to the higher HOMO (or valence band). Note that it is possible for a given material to be a hole acceptor with respect to one material and an electron acceptor with respect to another material.

Where the elements 103 are, e.g., in the form of nanotubes protruding from the template 105, the second and third charge-transfer materials 107, 109 can occupy spaces in the interiors of the nanotubes as well as the empty space between the tubes. In embodiments of the present invention, it is desirable that a lowest unoccupied molecular orbital (LUMO) or conduction band of the material of the template 105 differs from a LUMO or conduction band of the second charge-transfer material 107 by more than about 0.2 eV. Furthermore, it is desirable that at least one and possibly both charge-transfer materials absorb light or other radiation from some portion of the electromagnetic spectrum. More specifically, it is also desirable for at least one of the template material and second charge transfer material 107 to have an absorbance of greater than about $10^3$/cm at the peak of absorbance.

In the example shown in FIG. 1A, the second charge-transfer material 107 more or less conformally coats the walls and bottoms of the template elements 103, e.g., forming tubules, leaving behind additional space, e.g., in the form of tubule pores, which are filled by the third charge-transfer material 109. Each tubule can be characterized by an outside diameter roughly equal to the inside diameter of the corresponding template elements 103. Each tubule pore can be characterized by a tubule pore diameter d ranging from about 1 nm to about 500 nm. In general the tubule pore diameter d is less than the template element diameter C. By way of example, the tubules may have a tubule wall thickness of up to about 50 nm and a total tube height of up to up to about 2 microns.

Preferably, the second charge-transfer material 107 is also a material that absorbs light in the bulk of the material. In addition, the second charge-transfer material 107 may or may not absorb a substantial fraction of the incident light. Alternatively, the second charge-transfer material 107 can be a blend of two or more different materials, having, e.g., different light absorption and/or HOMO/LUMO levels.

The third charge transfer material 109 may be an electrically conducting material or p-type semiconductor. The third charge-transfer material 109 preferably is in the form of elongated "finger-like" structures that extend into the central interior of the structures, filling the space remaining in the structure interior after the second charge-transfer material 107 is deposited or otherwise formed. The tips of the "fingers" may optionally have plugs 114 of short-proofing material The plugs 114 may protect against undesired electrical contact between the third charge-transfer material 109 and the template 105 and/or underlying base electrode 110 and/or underlayer (if any). Examples of suitable short-proofing materials are described, e.g., in commonly assigned co-pending U.S. patent application Ser. No. 10/719,100, entitled "NANO-STRUCTURED OPTOELECTRONIC DEVICE WITH SHORT-PROOFING LAYER", filed Nov. 21, 2003, the disclosures of which are incorporated herein by reference. The second and/or third charge-transfer materials 107, 109 can be organic materials. Examples of suitable organic materials include conjugated polymers such as poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof. Other suitable polymers include organometallic polymers, polymers containing perylene units, poly(squaraines) and their derivatives, and discotic liquid crystals. Other suitable organic materials include organic pigments or dyes, azo-dyes having azo chromofores (—N=N—) linking aromatic groups, phthalocyanines including metal-free phthalocyanine; (HPc), Cu phthalocyanine (CuPc), Zinc phthalocyanine (ZnPc), perylenes, naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f']diisoquinoline-1,3,8,10-tetrone and small organic molecules such as pentacene and/or pentacene precursors. Blends of two or more of these materials can be combined as well.

The second and/or third charge-transfer materials 107, 109 may also include polyfluorenes and polyfluorene-based copolymers and blends, e.g. co-polymerized and/or blended with charge transporting (e.g. tri-phenyl-amines and derivatives) and/or light-absorbing compounds (e.g. fused thiophene rings and derivatives, generally hetero-atom ring compounds with or without substituents), pigments, dyes, or fullerenes.

Alternatively, the second and/or third charge-transfer materials 107, 109 may be made from an inorganic material. Examples of suitable inorganic materials include, e.g., metal oxides such as Titania ($TiO_2$), zinc oxide (ZnO), copper oxide (CuO or $Cu_2O$), copper sulfide (e.g., $Cu_2S$), zirconium oxide, lanthanum oxide, niobium oxide, tin oxide, indium oxide, tungsten oxide, vanadium oxide, molybdenum oxide, strontium oxide, calcium/titanium oxide and other oxides, sodium titanate, potassium niobate, Cadmium Selenide (CdSe), Zinc Selenide (ZnSe), Cadmium Sulfide (CdS), Cadmium Telluride (CdTe), Zinc Telluride (ZnTe), CIS, CISe, CIGS ($CuInGaSe_2$), i.e., generally conductive or semiconductive materials, e.g., p-type or n-type doped silicon (Si), as well as blends or alloys of two or more such materials. Methods for deposition of such materials include sol/sol-gel methods, layer-by-layer deposition (LBL), atomic layer deposition (ALD), plasma-enhanced atomic layer deposition (PEALD), evaporation, sputtering, chemical vapor deposition (CVD), metal-organic chemical vapor deposition (MOCVD), plasma-enhanced chemical vapor deposition (PECVD), pulsed CVD, etc. In general, the third charge-transfer material 109 may be created via deposition or reaction or condensation from the liquid or gas phase or by physical deposition methods. Furthermore the second and/or third charge-transfer material 109 may be deposited by atomic layer deposition (ALD), plasma-enhanced atomic layer deposition (PEALD), evaporation, sputtering, chemical vapor deposition (CVD), metal-organic chemical vapor deposition (MOCVD), plasma-enhanced chemical vapor deposition (PECVD), electro-deposition, electro-plating, ion-plating, chemical bath deposition, liquid phase deposition, and the like.

Figure 1D:
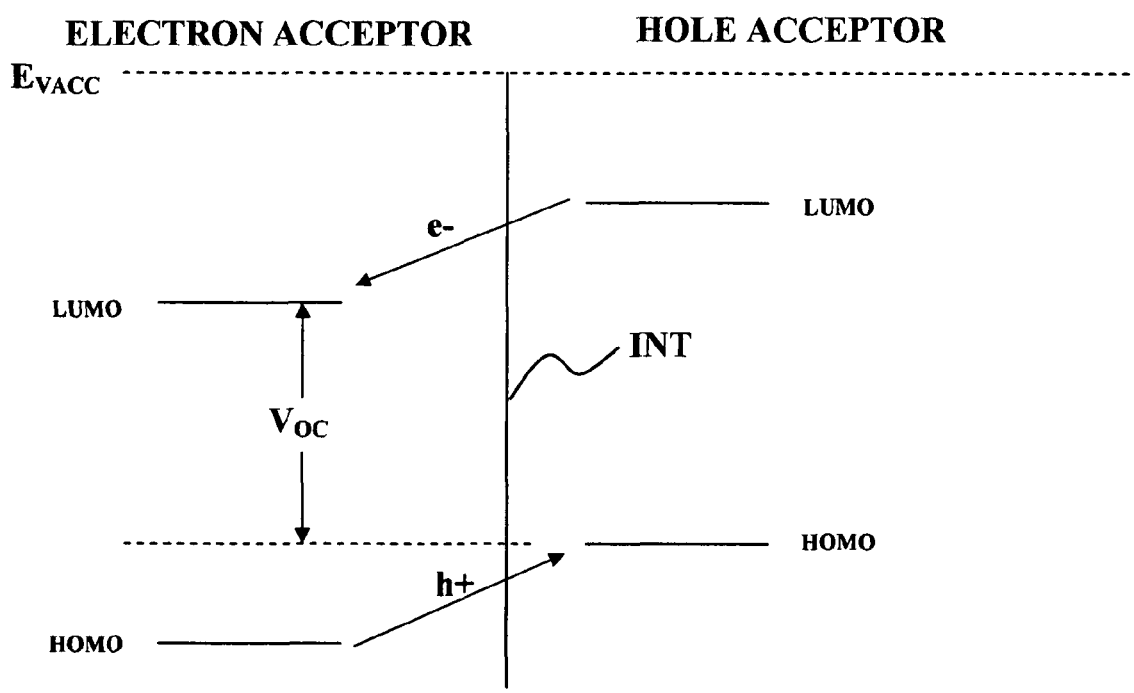
FIG. 1D is an energy level schematic diagram illustrating energy levels for two complementary charge-transfer materials.

The material of the template 105 and the second charge-transfer material 107 have complementary charge-transfer properties with respect to each other. In addition, the third charge transfer materials 109 may also have complementary charge transfer materials with respect to both the template 105 and first charge transfer material 107. In general one of the first and second charge-transfer materials may be regarded as an electron acceptor while the other may be regarded as a hole acceptor. The energy level diagram of FIG. 1D illustrates some general guidelines in determining which charge-transfer material may be regarded as a hole acceptor and transporter and which may be regarded as an electron acceptor and transporter. Charge-transfer materials may be characterized by a lowest unoccupied molecular orbital (LUMO) and a highest occupied molecular orbital (HOMO).

Figure 1E:
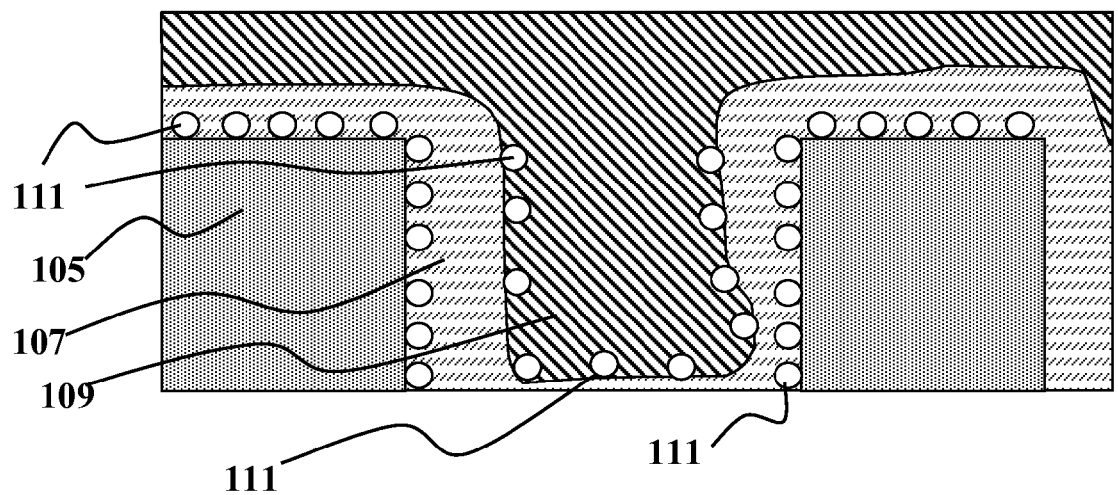
FIG. 1E is a vertical cross-sectional schematic diagram of a close-up view of a part of the device of FIG. 1A.

In a preferred embodiment, the device 100 may optionally include in the active layer 101 an interfacial layer 111 disposed between the template 105 and the second charge transfer material 107 or between the second and third charge-transfer materials 107, 109 or both as shown in FIG. 1E. The interfacial layer 111 may be configured to enhance the efficiency of the device 100 in the form of one or more of (a) differential charge transfer, i.e., charge-transfer between the two materials that exhibits different rates for forward versus backward transport; (b) differential light absorption to extend a range of wavelengths that the active layer can absorb; or (c) enhanced light absorption and/or charge injection. Examples of such interfacial layers are described in detail in commonly assigned U.S. patent application Ser. No. 10/419,708, the entire disclosures of which are incorporated herein by reference.

By way of example, the interfacial layer 111 may contain organic materials attached to the template 105. Examples of such organic materials include fullerenes (e.g., $C_{60}$, $C_{70}$ and the like), carbon nanotubes, dyes, ruthenium dyes, pigments, and organic monomers, oligomers, and polymers, any of which may be deposited singly or in combination onto the template 105. Although the interfacial layer 111 is depicted as a monolayer in FIG. 1E, multi-layer interfacial layers may be used as well. The interfacial layer 111 may be in the form of individual molecules, monomers or oligomers or a continuous or substantially continuous layer between the template 105 and the first charge transfer material 107 or between the first and second charge-transfer materials 107 and 109. In a particular embodiment, the interfacial layer 111 can include fullerenes. Fullerenes such as $C_{60}$ can also be functionalized, e.g., so that they can be attached covalently to the walls of the tubule pores and/or bulk material of the template 105.

The interfacial layer 111 may also include chemicals that can covalently attach to the template 105, e.g., a silane, and thus change the surface energy and/or bonding trap-states and/or attach to dangling-bonds at an exposed surface of the template 105 and/or introduce a dipole layer that may increase the efficiency for charge extraction and/or reduce detrimental charge recombination. Examples are functionalization with benzoic, various carboxylic-acid-group-containing materials and other acids, tert-butyl-pyridine, surfactants, dye molecules, silanes and silicon compounds or their functionalized derivatives which are often used as adhesion-promoters. The surface of the template 105 may also be functionalized with silylating agents for modulation of surface properties, and/or for introduction of functional groups (amine group, aliphatic group, hydroxyl, carboxylic etc.) for further surface derivitization. In particular, the interfacial layer 111 may be a layer of $C_{60}$ or other fullerenes functionalized with a carboxylic acid, moiety combined with hydroxylating a metal oxide template material produces preferential charge flow into or out of the template 105. Such a layer can also prevent undesired direct electrical contact between the third charge-transfer material 109 and the template 105. Furthermore, the interfacial layer 111 may be a recombination-reducing inorganic material, such as a thin layer of aluminum oxide deposited, e.g., via ALD or liquid-phase deposition.

Although the second and third charge-transfer materials 107, 109 are described as being respectively an inorganic material and an organic material, it is possible to make the active layer 101 with the second charge-transfer material 107 organic and the third charge-transfer material 109 inorganic or with both charge-transfer materials 107, 109 being either both organic or both inorganic. One possible way in which the second charge-transfer material 107 may be inorganic while the third charge-transfer material 109 is also inorganic is deposit the first inorganic charge-transfer material using atomic layer deposition (ALD), which allows for uniform, conformal coverage of the nanotemplate, and then deposit the second inorganic charge transfer material also using atomic layer deposition (ALD). In a first preferred embodiment of the invention the third charge-transfer material 109 is in the form of thin elongated structures of a transparent conductive material (e.g., PEDOT, PEDOT doped with a dopant such as polystyrene sulfonic acid (PSS), doped 2,2'7,7'-tetrakis(N,N-di-p-methoxyphenyl-amine)-9,9'-spirobifluorene (spiro-MeOTAD), or polyaniline doped with a dopant such as polystyrene sulfonic acid (PSS)) that conformally coats and interdigitates into the second charge transfer material 107 (e.g., a p-type organic layer) which conformally coats an n-type nanostructured nanotemplate 105. The utility if this configuration arises in part from the fact that charge carriers only having to travel a very short distance to reach a conductive material leading to an electrode, decreasing the requirement for high charge mobility charge-carrying materials.

In a second preferred embodiment, the third charge transfer material 109 is in the form of thin elongated structures of an organic material, e.g., a p-type polymer or small molecule layer with a certain absorption range and HOMO/LUMO level that conformally coats and interdigitates into the second charge-transfer material 107, e.g., a different p-type polymer or small molecule layer with a different/complimentary absorption range and different/complimentary HOMO/LUMO level than the third charge transfer material 109. By way of example, the second charge transfer material 107 can be a p-type polymer that conformally coats an n-type nanotemplate 105. The utility of this configuration arises in part from the use of complimentary polymers or small molecules which together extend the absorption range for incoming light, which also results in the potential use of thinner cells (collecting the same amount of energy compared to thicker cells which only use one absorbing material).

IV. Photovoltaic Device Fabrication

Figure 2:
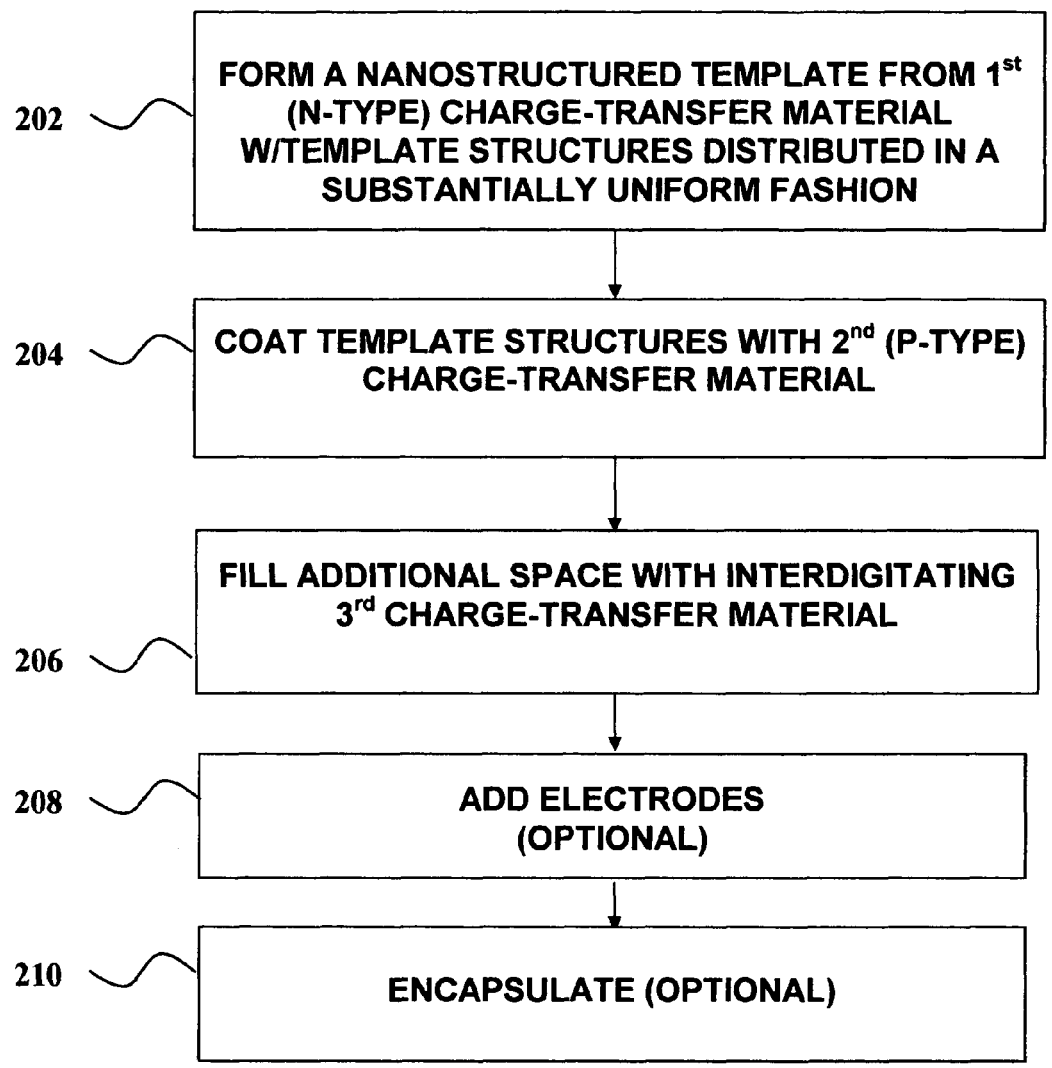
FIG. 2 is a flow diagram illustrating a method for making a device according to another embodiment of the invention.

Apparatus of the type shown in FIGS. 1A-1E can be fabricated according to embodiments of an inventive method. FIG. 2 depicts a flow diagram illustrating an example of such a method 200. Examples of how the method might be carried out are depicted in the sequences of cross-sectional diagrams depicted in FIGS. 3A-3M. The method 200 begins at 202 by forming a nanostructured template made of a first charge-transfer material, e.g., by anodizing a layer of metal, e.g., a metal substrate or a substrate with at least one metal coating, having an array of template elements distributed in a substantially uniform fashion. At 204 the template elements are coated with a second charge-transfer material having complementary charge-transfer properties with respect to the material of the template. At 206, a third (optional) charge-transfer material fills additional space not occupied by the first charge-transfer material. Electrodes may optionally be added at 208 and the resulting device may optionally be encapsulated at 210.

A. Forming a Nanostructured Template

Figure 3A:
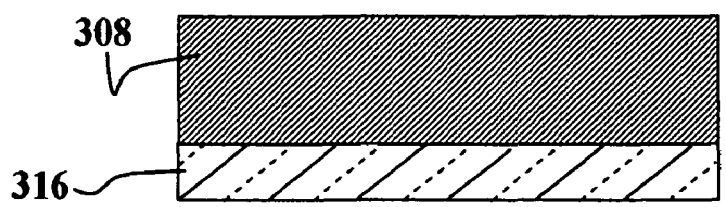
FIGS. 3A-3E depict a series of vertical cross-sectional schematic diagrams illustrating one possible sequence of steps for carrying out the method of FIG. 2.
Figure 3B:
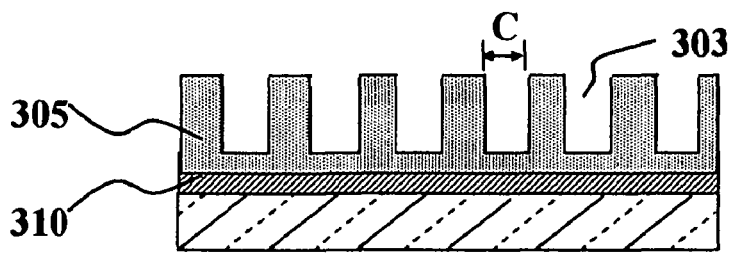

With respect to step 202 of FIG. 2, there are a number of different ways to form a porous template. In a preferred embodiment, as shown in FIGS. 3A-3B, a porous template can be anodized from a layer of metal 308 (e.g., titanium, zinc or other metals whose oxides are n-type semiconductors) disposed on a substrate 316. An optional under layer (not shown) may be disposed between the substrate 310 and the metal layer 308. By way of example, when a metal layer is treated anodically in an acid electrolyte, an oxide film 305 can be formed at the metal surface as shown in FIG. 3B. An array of template elements 303 can be formed in the oxide film 305 (e.g., titania or zinc oxide or other n-type semiconducting oxides), while the oxide film 305 is created. For an oxide film 305 made of a semiconducting or conducting oxide such as titanium oxide or zinc oxide, the template elements 303 need not extend all the way through the film 305 to the underlying substrate 316. It is often desirable for the elements 303 to stop short of the substrate 316 leaving a portion of the oxide film 305 to act as an underlayer between the elements 303 and an unoxidized portion which acts as an electrode 310.

The optimal thickness range for the metal layer to be anodized is from about 100 nm to about 2 microns, preferably in the 200-nm to 600-nm range, e.g., about 300 nm. The elements 303, e.g., pores, may extend through the oxide film 305. Porous templates in these thickness ranges provide useful depths for proper optoelectronic function in the resulting PV device. To anodize the metal substrate (e.g. titanium) to its porous metal oxide equivalent (e.g. titania), the anodization voltage, current, acid concentration, anodization time, and temperature can be adjusted to improve pore formation in a metal film whose initial thickness ranges from (for example) 100-250 nm. In particular, based on the thickness of the metal substrate, the anodization voltage, current, acid type, acid concentration, electrolyte additives, anodization time, and temperature can be adjusted to provide for a porous template with specific target dimensions.

Template element sizes in such films typically range from 10 to 250 nm, though it is also possible to form elements as small as 2 nm and as large as 500 nm. The typical template element density is about $10^{12}$ to about $10^{16}$ elements per square meter. A film thickness of 100 to 500 nanometers is generally achieved, though films can be formed whose thickness is as small as 10 nm and as great as 1000 nm.

It is also possible to make the porous template by anodizing a metal layer to form an oxide film on glass, ITO-coated glass, $SnO_2$ coated glass, $F:SnO_2$ coated glass, ITO coated PET or other plastic, or other coated or non-coated metal foils as well as metallized plastics. More specifically, the substrate 316 can be a sheet of glass or plastic or metal or a continuous foil of metal or plastic with an unanodized portion of the metal layer 308 acting as a base electrode. Alternatively, the metal layer 308 can be anodized all the way through to the substrate 316 (or underlayer), which can act as a base electrode (transparent or otherwise).

Figure 1F:
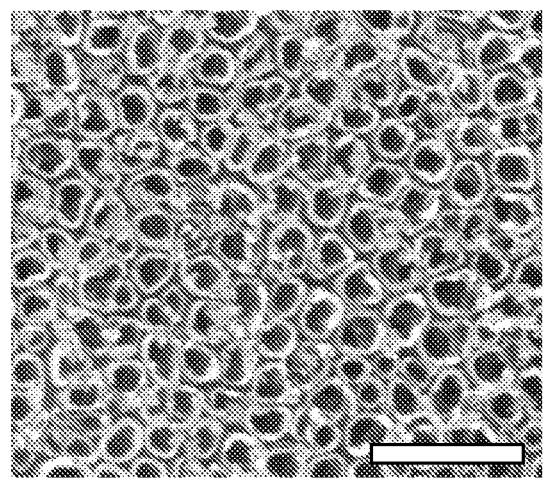
FIG. 1F depicts a scanning electron microscope (SEM) top-down image of a nanostructured titania template.

A native n-type nanotemplate can be formed using a thin flexible Ti foil, which is directly anodized in acidic solution (such as dilute HF) at 10-20 V and room temperature for 5-60 minutes (Zwilling et al., 1999; Gong et al., 2001; Beranek et al. 2003). Depending upon the voltage, acid strength, temperature, and time, nanotubes of targeted diameter, height, and spacing can be generated with a uniform distribution across the surface. Anodization can be also be carried out in a base (such as NaOH). The pH of the anodization solution can be altered by changing the concentration of the acid or base in the solution, or by mixing in a second acid or base, or both. The voltage is typically set and adjusted by using a computer-controlled power supply, which can monitor the voltage as a function of time in real-time. The temperature is typically controlled by carrying out the anodization in a water bath set to a defined temperature. A temperature monitor can be placed into the water bath to determine the temperature, and this monitor can be integrated into a feedback-loop driven temperature control system. An example of a nanostructured titania template made in this way is depicted in the SEM images of FIG. 1F. The scale bar in FIG. 1F is 100 nm. The titania nanotubes depicted are roughly 35 nm in diameter.

In an alternative embodiment, a semiconducting nanostructured template may be fabricated as follows. A suitable semiconducting material, e.g., n-type, may be deposited on an electrode. A layer of aluminum may then be deposited or otherwise formed on the surface of the semiconducting material. The aluminum layer may then be anodized all the way down to the layer semiconducting material forming a nanostructured template of insulating alumina. The alumina template may then be used as an etch mask for an etching process that etches the template elements into the semiconducting layer. The alumina template may be removed either during the etching process or subsequent to it. Such a technique may be used to nanostructure many different types of semiconductors including types that cannot be nanostructured by anodizing a metal layer. In a preferred embodiment, a layer of metal, e.g., titanium foil, may be partially anodized such that an anodized portion forms the template 305 and an un-anodized portion acts as the electrode 310 and may also serve as the substrate 316. Portions 312 of the template 305 proximate an interface between the anodized and un-anodized portions may act as the underlayer.

B. Coating the Template Elements with the Second Charge-Transfer Material

Figure 3C:
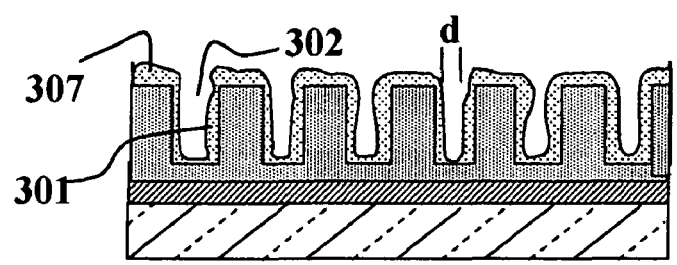

With respect to 204 of FIG. 2, a variety of deposition techniques, including those described above, could be employed to fill the template elements 303. Such techniques include, but are not limited to, electrochemical and electroless (chemical bath) deposition, layer-by-layer (LBL) deposition, evaporation, sputtering, plating, ion-plating, molecular beam epitaxy, and sol-gel based deposition, vapor-phase deposition, solvent vapor deposition, atomic layer deposition, atomic vapor deposition, metal-organic vapor phase deposition, metal-organic-vapor-phase epitaxy, self-assembly, electro-static self-assembly, melt-filling/coating, among other techniques. The second charge-transfer material 307 coats the template elements 303 in a way that forms thin tubules 301 that coat the walls of the template elements 303 as shown in FIG. 3C. The tubules 301 have tubule pores 302 left behind by the tubule forming process. For example, a semiconductor can be coated on the walls of the template elements 303, e.g., by sputtering, CVD techniques or atomic layer deposition.

Although, the preceding example describes coating the template elements 303 with an inorganic material, the template elements 303 may alternatively be filled with an organic material such as those listed above. Furthermore, both the second charge transfer material 307 and a complementary third charge transfer material 309 can be inorganic or both could be organic. Furthermore, the second and third charge transfer materials 307, 309 could both be the same material.

C. Filling Additional Space with the $3^{rd}$ Charge-Transfer Material

Figure 3D:
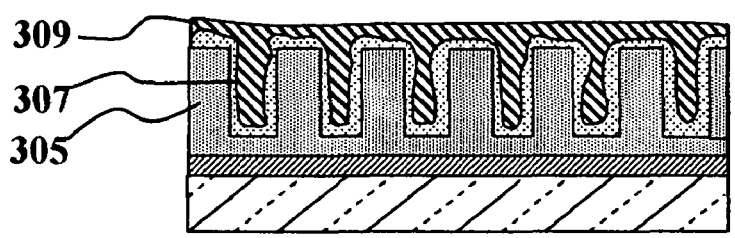

With respect to 206 of FIG. 2, there are several different ways to fill additional space not filled by the second charge transfer material 307. For example, the third charge-transfer material 309 can fill the tubule pores 302 as shown in FIG. 3D. Short proofing material may optionally be deposited into the bottoms of the tubule pores 302 to form protective plugs. The short proofing material may be deposited before depositing the second charge-transfer material 307. The second and third charge-transfer materials 307, 309 can both be organic materials as described above. Such organic materials can be deposited by capillary action melting, and/or through the assistance of surface energy or osmotic gradients or solvent vapor exposure. Organic polymers and other materials can be used, alone or in combination, at this step, such as those described above. Organic charge-transfer materials can be applied to the tubule pores 302 from process solutions, e.g., by any suitable technique, e.g., casting, dip-coating, web-coating, solvent vapor infiltration, solvent vapor deposition, organic vapor phase deposition (OVPD), doctor blade coating, spray coating, spin coating, or a printing technique such as printing such as screen-printing, ink-jet printing, flexographic printing, gravure printing, micro-gravure printing, and the like. Alternatively, organic materials may be evaporated. Furthermore, inorganic materials may also be deposited, using any of several techniques, such as those described above, including but not limited to sol-gel chemistry, layer-by-layer (LBL) deposition, spray pyrolysis, evaporation, atomic layer deposition (ALD), plasma-enhanced atomic layer deposition (PECVD), chemical vapor deposition (CVD), metal-organic chemical vapor deposition (MOCVD), plasma enhanced chemical vapor deposition (PECVD), sputtering, and the like. Heat may be applied to the nanostructured network layer and network-filling material during this step, e.g., for organic deposits, to evaporate solvents and set the network-filling material and/or to assist material infiltration, e.g., through capillary action and/or assistance of surface energy or osmotic force, or for inorganic deposits, to anneal the inorganic material. In a preferred embodiment, the organic material may be exposed to a solvent vapor to facilitate infiltration into the tubule pores 302.

Alternatively, as described above, the second charge-transfer material can include fullerenes ($C_{60}$ and $C_{70}$ and the like), functionalized fullerenes, carbon nanotubes, dyes, ruthenium dyes, pigments, and organic monomers, oligomers, and polymers, any of which may be deposited singly or in combination into the nano-structure. These organic materials can be deposited using any of several techniques, including but not limited to solvent vapor deposition, vapor phase deposition, capillary action, and/or through osmotic gradients, using liquid solutions containing the materials to be deposited or by evaporation of the organic material into the template elements 303. If deposition is carried out using capillary action, gentle heating at about 150-200° C. for about 1-10 minutes can be used during material deposition. In addition, carbon nanotubes can be synthesized directly within the template elements 303 or the tubule pores 302 using, for example, chemical vapor deposition (CVD). In addition, the second and/or third charge-transfer materials 307, 309 can be inorganic materials deposited by suitable techniques described above, including, but not limited to, ALD, PEALD, CVD, PECVD, MOCVD, sputtering, evaporation, electrodeposition, chemical bath deposition, LBL, and the like. Furthermore, the second and/or third charge-transfer materials 307, 309 and/or an interfacial layer like that described above with respect to FIG. 1E can be created by self-assembly or electro-static self-assembly of materials such as PEDOT/PSS or other materials deposited from ionic/charged polymer solutions (e.g. tetra-hydro-thiophene precursor poly-phenylene-vinylene and derivatives).

Figure 3E:
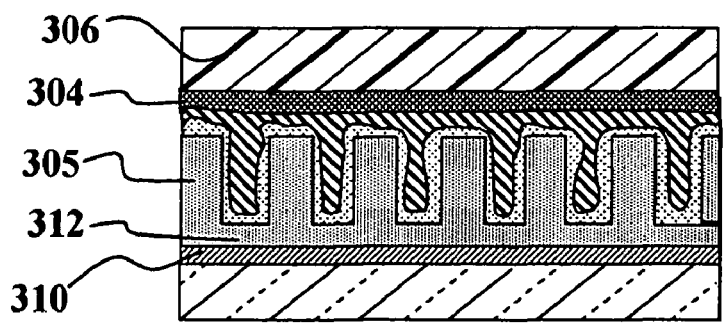

The device can be finished as shown in FIG. 3E. An interlayer 304, e.g., a polymer such as PSS:PEDOT may optionally be deposited on top of the third charge-transfer material 309. An electrode in the form of a fine metal grid or thin metal film can then be added. The final device may be encapsulated to provide for mechanical stability and/or protection from the ambient environment.

V. Alternative Embodiments

Although that the template 105 is described as being made of an inorganic material and the second and third charge-transfer materials 107, 109 are both organic, other configurations of the active layer 101 are possible, including all organic and/or all inorganic devices. In general, organic materials tend to be more fragile than inorganic materials. In embodiments of the present invention more fragile materials may generally be layered onto or into less fragile materials but usually not vice versa. Thus, for example, the template 105 and second charge transfer material 107 could be inorganic, while the third charge-transfer material 109 would typically be organic. Furthermore all three charge-transfer materials may be either entirely organic or entirely inorganic. There are however potential embodiments where an inorganic material is layered upon an inorganic material. For example a functionalized $C_{60}$ such as $C_{60}$—COOH, serving as an interfacial layer coating an underlying material may be coated with an inorganic material. In that case, it is desirable to deposit the inorganic material under conditions that do not lead to the destruction or substantial degradation of the organic material, e.g. by avoiding exposure to plasma or extremely high heat during the process of inorganic deposition.

The devices described herein incorporate several advances over prior art devices. Specifically, the devices described herein are solid-state devices that do not contain a liquid electrolyte. Therefore, devices according to embodiments of the present invention are subject to significantly fewer leakage and corrosion problems of the type associated with devices using liquid electrolytes. Furthermore, the devices described herein have a charge splitting layer having with a more uniform structure than prior art devices. In particular, the devices described herein have an active layer characterized by volumetrically interdigitating charge-transfer materials with regularly arrayed template elements having substantially uniform spacing within the plane of the active layer and substantially parallel orientation and uniform length perpendicular to the plane of the active layer. Thus, the charge-splitting layer exhibits a three-dimensional topology that is very regular along its length and width, but also along its depth.

In addition, the devices described herein do not depend entirely on a monolayer of a dye adsorbed to an n-type inorganic material as a light absorber. Instead, devices according to embodiments of the present invention typically use a p-type light absorber capable of absorbing light in the bulk of the material. Consequently, devices of the type describe herein absorb light more effectively and can be more efficient on a volume basis in converting incident light to electrical energy. Although a dye may optionally be included in the devices described herein, a dye is not needed for the device to convert light into electrical energy, as is the case for dye-sensitized solar cells. Thus, the devices described herein are not "dye-sensitized".

In addition, devices of the type described herein may be made substantially thinner than prior art devices. For example, at about 2 microns thick, or substantially less, solar cell devices according to embodiments of the present invention may be significantly thinner than the typically 8-10 micron thick Graetzel cells or the typically 4-5 micron thick purely inorganic cells.

Furthermore, unlike cells comprised of sintered particles, the template-filler method of construction described herein is based on a substantially self-assembling template, that exhibits much greater long-range order.

Furthermore, the devices described herein do not use a liquid-based electrolyte nor "redox" chemistry to transport holes away from the light absorbing material. Instead, a p-type organic solid-state material transports holes from the charge splitting interface.

VI. Conclusion

Embodiments of the present invention allow for large-scale, low-cost production of efficient photovoltaic devices, such as solar cells or other devices.

While the above is a complete description of the preferred embodiment of the present invention, it is possible to use various alternatives, modifications and equivalents.

What is claimed is:

1. A photovoltaic device, comprising:
    a nanostructured template made from an n-type first charge transfer-material, the nanostructured template having template elements between about 1 nm and about 500 nm in diameter with a template element density of between about $10^{12}$ elements/m$^2$ and about $10^{16}$ elements/m$^2$;
    a second charge-transfer material conformally coating one or more walls of the template elements leaving additional space, wherein the first charge-transfer material is n-type and the second charge-transfer is p-type; and
    a third material in the additional space, wherein the third material is a p-type or conducting material that volumetrically interdigitates with the second charge-transfer material.

2. The device of claim 1 wherein the third charge-transfer material in the form of one or more elongated structures that volumetrically interdigitate with the second charge transfer material.

3. The device of claim 2, further comprising a base electrode and a top electrode, wherein the nanostructured template is disposed between the base electrode and top electrode.

4. The device of claim 3, wherein the first charge-transfer material is in electrical contact with the base electrode and the third charge-transfer material is in contact with the top electrode.

5. The device of claim 3, further comprising one or more plugs of material at the tips of the elongated structures, wherein the plugs protect against undesired electrical contact between the third charge-transfer material and the template and/or base electrode.

6. The device of claim 1 wherein the first, second, or third charge-transfer material includes one or more materials from the group of titanium oxide, zinc oxide (ZnO), copper oxide, copper sulfide, zirconium oxide, lanthanum oxide, niobium oxide, tungsten oxide, tin oxide, indium tin oxide (ITO), strontium oxide, calcium/titanium oxide, indium oxide, vanadium oxide, zirconium oxide, molybdenum oxide, vanadium oxide, strontium oxide, sodium titanate, potassium niobate, silicon, tungsten oxide, cadmium selenide (CdSe), zinc selenide (ZnSe), cadmium sulfide (CdS), cadmium telluride (CdTe), cadmium selenide (CdSe), cadmium telluride selenide (CdTeSe), CIS, CISe, CIGS ($CuInGaSe_2$), copper-indium selenide, cadmium oxide, or blends or alloys of two or more of these materials.

7. The device of claim 1 wherein the first charge-transfer material includes a transparent conductive oxide.

8. The device of claim 7 wherein the first charge-transfer material includes titanium oxide or zinc oxide.

9. The device of claim 1, further comprising an interfacial layer disposed between the first and second charge-transfer materials.

10. The device of claim 9 wherein the interfacial layer includes one or more materials chosen from the group of fullerenes, doped fullerenes, functionalized fullerenes, $C_{60}$—COOH, doped functionalized fullerenes, azafullerenes, polymerized fullerenes (doped or undoped), functionalized polymerized fullerenes (doped or undoped), phenyl-$C_{61}$-butyric acid methyl ester (PCBM), carbon nanotubes, dyes, ruthenium dyes, pigments, organic monomers, oligomers, and polymers, tetra-hydro-thiophene precursor polymers and derivatives thereof, poly-phenylene-vinylene and derivatives thereof, conjugated polymers, and/or blends of these materials.

11. The device of claim 9 wherein the interfacial layer includes one or more chemicals that can covalently attach to the first charge-transfer material and change a surface energy and/or bonding trap-states and/or attach to dangling-bonds at an exposed surface of the first charge-transfer material and/or introduce a dipole layer that may increase the efficiency for charge extraction and/or reduce detrimental charge recombination.

12. The device of claim 1 wherein the second charge-transfer material includes two or more complementary charge-transfer materials that are blended together.

13. The device of claim 1 wherein the template elements are in the form of hollow tubes that protrude from the template with spaces between the sidewalls of the tubes.

14. The device of claim 1 wherein the third charge transfer material includes one or more transparent conducting materials.

15. The device of claim 14 wherein the one or more transparent conducting materials include PEDOT, PEDOT doped with a dopant PEDOT doped with polystyrene sulfonic acid (PSS), doped 2,2'7,7'-tetrakis(N,N-di-p-methoxyphenyl-amine)-9,9'-spirobifluorene (doped spiro-MeOTAD), doped spiro-MeOTAD, polyaniline doped with a dopant, and/or polyaniline doped with a dopant polystyrene sulfonic acid (PSS)).

16. The device of claim 14 wherein the one or more transparent conducting materials conformally coat and interdigitate into the second charge transfer material.

17. The device of claim 3 wherein the top electrode, either with or without a transparent conductive oxide, comprises a transparent conducting polymer, a thin metal layer, or an array of spaced apart wires.

18. The device of claim 17 wherein the transparent conducting oxide (TCO) comprises one of indium tin oxide (ITO), Zinc Oxide (ZnO), or fluorinated tin oxide ($F:SnO_2$).

19. The device of claim 17 wherein the array of spaced apart wires is in the form of a mesh, grid or parallel wires.

20. The device of claim 3 wherein the base electrode comprises a C-, Au-, Ag-, Al-, or Cu-coated steel foil or a non-coated metal foil.

* * * * *